United States Patent
Liang et al.

(10) Patent No.: US 9,036,335 B2
(45) Date of Patent: May 19, 2015

(54) LOCK MECHANISM AND RELATED ELECTRONIC DEVICE

(71) Applicant: Wistron Corporation, New Taipei (TW)

(72) Inventors: Jyun-Shuo Liang, New Taipei (TW); Hung-Li Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 335 days.

(21) Appl. No.: 13/712,979

(22) Filed: Dec. 13, 2012

(65) Prior Publication Data

US 2014/0092533 A1   Apr. 3, 2014

(30) Foreign Application Priority Data

Oct. 3, 2012 (TW) ............................. 101136514 A (51) Int. Cl.
*H05K 5/02* (2006.01)
*G06F 1/16* (2006.01)

(52) U.S. Cl.
CPC ........... *H05K 5/0221* (2013.01); *Y10T 403/602* (2015.01); *Y10T 403/70* (2015.01); *G06F 1/1635* (2013.01); *G06F 1/1656* (2013.01)

(58) Field of Classification Search
CPC ... H04M 1/0262; H04M 1/026; G06F 1/1635; G06F 1/1613; G06F 1/1632; G06F 1/1656; G06F 1/263; G06F 1/1601; G06F 1/1626; G06F 3/0317; G06F 3/03545; G06F 1/1684; G06F 1/1688; G06F 2200/1614; G06F 2200/1637; G06F 2203/0384; G06F 3/0488; G06F 3/16; G06F 1/1662; G06F 1/1686; G06F 1/1696; G06F 1/18; H05K 5/0221; H05K 7/00

USPC ............ 361/679.01, 679.02, 679.09, 679.21, 361/679.26, 679.27, 724–727, 361/679.44–679.58; 403/327, 345; 312/223.1–223.2

See application file for complete search history.

(56) References Cited

U.S. PATENT DOCUMENTS 8,422,209 B2 * 4/2013 Cheng et al. ............. 361/679.01

FOREIGN PATENT DOCUMENTS

| TW | I363554 | 5/2012 |
| TW | M430132 | 5/2012 |

* cited by examiner

*Primary Examiner* — Anthony Haughton
*Assistant Examiner* — Ingrid Wright
(74) *Attorney, Agent, or Firm* — Winston Hsu; Scott Margo (57) ABSTRACT

A lock mechanism includes a base, a constraining component, a recovering component, a bridging component and an actuating component. The constraining component contacts against a fix portion of an electronic component to constrain its movement. The recovering component includes a bar, a first inclined structure and a second inclined structure. The bar includes a first end and a second end. The first inclined structure is disposed on the first end to push the fix portion, and the second inclined structure is disposed on the second end. Two ends of the bridging component respectively connect to the constraining component and the actuating component. The actuating component movably pierces through a hole on the base to separate the constraining component from the fix portion via the bridging component, and the actuating component further pushes the second inclined structure, so as to drive the first inclined structure to outwardly move the fix portion.

20 Claims, 9 Drawing Sheets

LOCK MECHANISM AND RELATED ELECTRONIC DEVICE

BACKGROUND OF THE INVENTION

1. Field of the Invention

The present invention relates to a lock mechanism and a related electronic device, and more particularly, to a lock mechanism and a related electronic device capable of releasing lock constraint and ejecting an electronic component simultaneously by one touch.

2. Description of the Prior Art

The electronic component applied to the notebook computer, such as the battery or the portable hard disk, is installed on the bottom of the notebook computer. The notebook computer is rotated to assemble and to disassemble the electronic component from the bottom of the notebook computer. Generally, the conventional latch mechanism, which is disposed on the bottom of the notebook computer, is utilized to assemble and disassemble the electronic component from a casing of the notebook computer. Operating procedure of the conventional latch mechanism is complicated and inconvenient, so quality impression and satisfaction of the notebook computer with the conventional latch mechanism are accordingly decreased. Thus, design of a lock mechanism capable of rapidly and conveniently assembling/disassembling the electronic component is an important issue of the mechanical industry.

SUMMARY OF THE INVENTION

The present invention provides a lock mechanism capable of releasing lock constraint and ejecting an electronic component simultaneously by one touch and a related electronic device for solving above drawbacks.

According to the claimed invention, a lock mechanism includes a base, at least one constraining component, at least one recovering component, a bridging component and an actuating component. A hole is formed on a surface of the base. The constraining component is movably disposed on the base. The constraining component contacts against a fix portion of an electronic component to constrain a movement of the electronic component. The recovering component is movably disposed on the base. The recovering component includes a bar, a first inclined structure and a first inclined structure. The bar includes a first end and a second end, the second end is opposite to the first end. The second inclined structure is disposed on the second end of the bar. The actuating component movably passes through the hole on the base. Two ends of the bridging component are respectively connected to the constraining component and the actuating component. The actuating component moves relative to the hole to drive the bridging component to separate the constraining component from the fix portion. The actuating component further pushes the second inclined structure to move the fix portion via the first inclined structure.

According to the claimed invention, the fix portion includes a stop structure and a guide structure. The constraining component contacts against the stop structure, and the first inclined structure contacts against the guide structure.

According to the claimed invention, the bridging component is a linkage. An end of the linkage pivots to the constraining component, and the other end of the linkage is slidably disposed on a guide slot on the actuating component.

According to the claimed invention, the actuating component moves relative to the base along a first direction, and the constraining component moves relative to the base along a second direction substantially perpendicular to the first direction. A structural direction of the guide slot is between the first direction and the second direction.

According to the claimed invention, the first direction is substantially parallel to a planar normal vector of the base.

According to the claimed invention, the recovering component comprises a wedged structure for wedging with the fix portion.

According to the claimed invention, the bridging component includes a cable and a roller. Two ends of the cable are respectively connected to the constraining component and the actuating component, and the cable moves relative to the roller.

According to the claimed invention, the actuating component includes a first actuating portion and a second actuating portion. The bridging component is disposed between the first actuating portion and the constraining component. The second actuating portion is disposed on a position adjacent to the first actuating portion and contacts against the second inclined structure.

According to the claimed invention, an inclined angle of the guide slot is substantially greater than an inclined angle of the second actuating portion.

According to the claimed invention, the lock mechanism further includes a resilient component disposed on the bar of the recovering component. The resilient component drives the recovering component to push the actuating component.

According to the claimed invention, an electronic device includes an electronic component, a casing and a lock mechanism. The electronic component includes a fix portion. The casing includes a sunken structure. An opening is formed on a lateral wall of the sunken structure. The electronic component is accommodated inside the sunken structure. The lock mechanism is disposed inside the casing. The fix portion of the electronic component passes through the opening to be locked by the lock mechanism. The lock mechanism includes a base, at least one constraining component, at least one recovering component, a bridging component and an actuating component. A hole is formed on a surface of the base. The constraining component is movably disposed on the base. The constraining component contacts against the fix portion of the electronic component to constrain a movement of the electronic component. The recovering component is movably disposed on the base. The recovering component includes a bar, a first inclined structure and a first inclined structure. The bar includes a first end and a second end, the second end is opposite to the first end. The second inclined structure is disposed on the second end of the bar. The actuating component movably passes through the hole on the base. Two ends of the bridging component are respectively connected to the constraining component and the actuating component. The actuating component moves relative to the hole to drive the bridging component to separate the constraining component from the fix portion. The actuating component further pushes the second inclined structure to move the fix portion via the first inclined structure.

The lock mechanism of the present invention connects the first actuating portion and the second actuating portion of the actuating component respectively to the constraining component and the recovering component. When the actuating component is pressed, the first actuating portion can utilize the bridging component to move the constraining component, so as to separate the wedged structure from the fix portion. Meanwhile, the second actuating portion slides relative to the second inclined structure, so the first inclined structure of the recovering component can push the fix portion to separate the electronic component from the sunken structure. As the external force applied to the actuating component is removed, the resilient recovering force of the resilient component reversely drives the recovering component, and the recovering component can push the actuating component out of the hole on the base. Due to the movement of the actuating component, the first actuating portion can push the constraining component via the bridging component, and the lock mechanism is back to the initial mode. It is to say, the lock mechanism of the present invention can be utilized to release the constraint of the fix portion by the constraining component and to drive the recovering component to push the fix portion for separation of the electronic component simultaneously by one touch. Therefore, the lock mechanism of the present invention has advantages of simple structure, operation convenience and low manufacturing cost. The present invention can guide the perpendicular pressing force to drive the lock mechanism in parallel movement, so the volume of the lock mechanism can be minimized to preferably apply to the thin-type electronic device, so as to increase market competition of the product.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
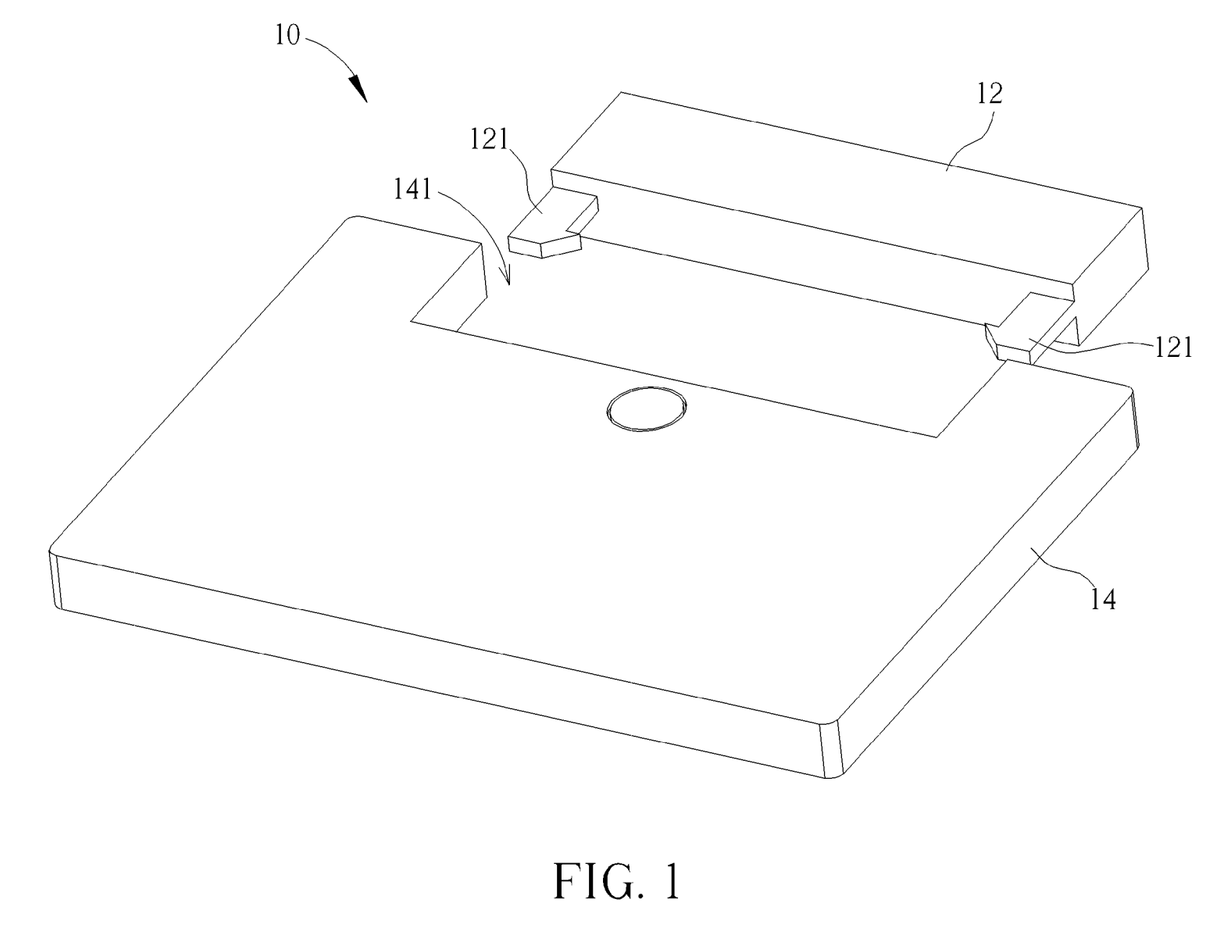
FIG. 1 and FIG. 2 respectively are diagrams of an electronic device in different views according to an embodiment of the present invention.
Figure 2:
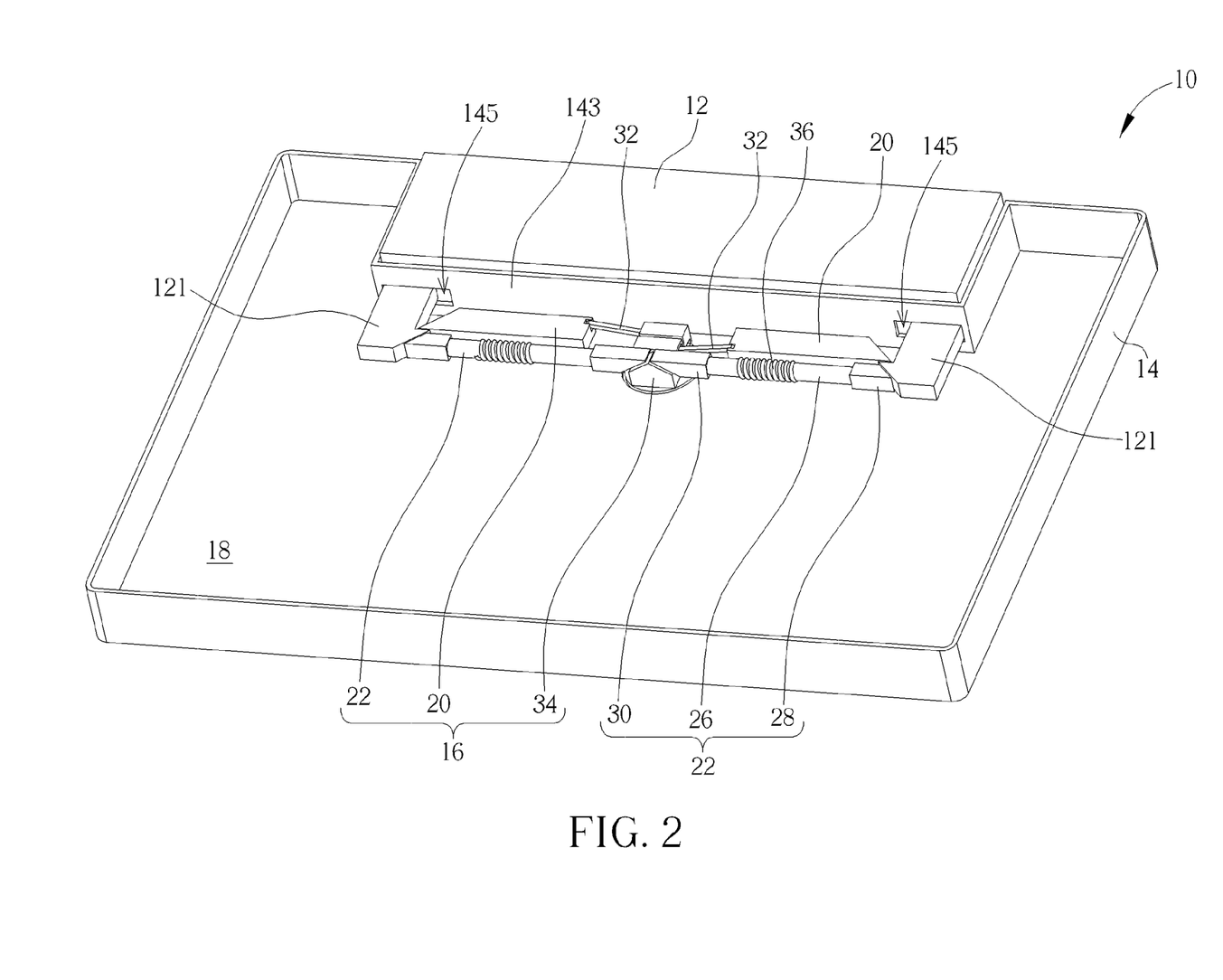
Figure 3:
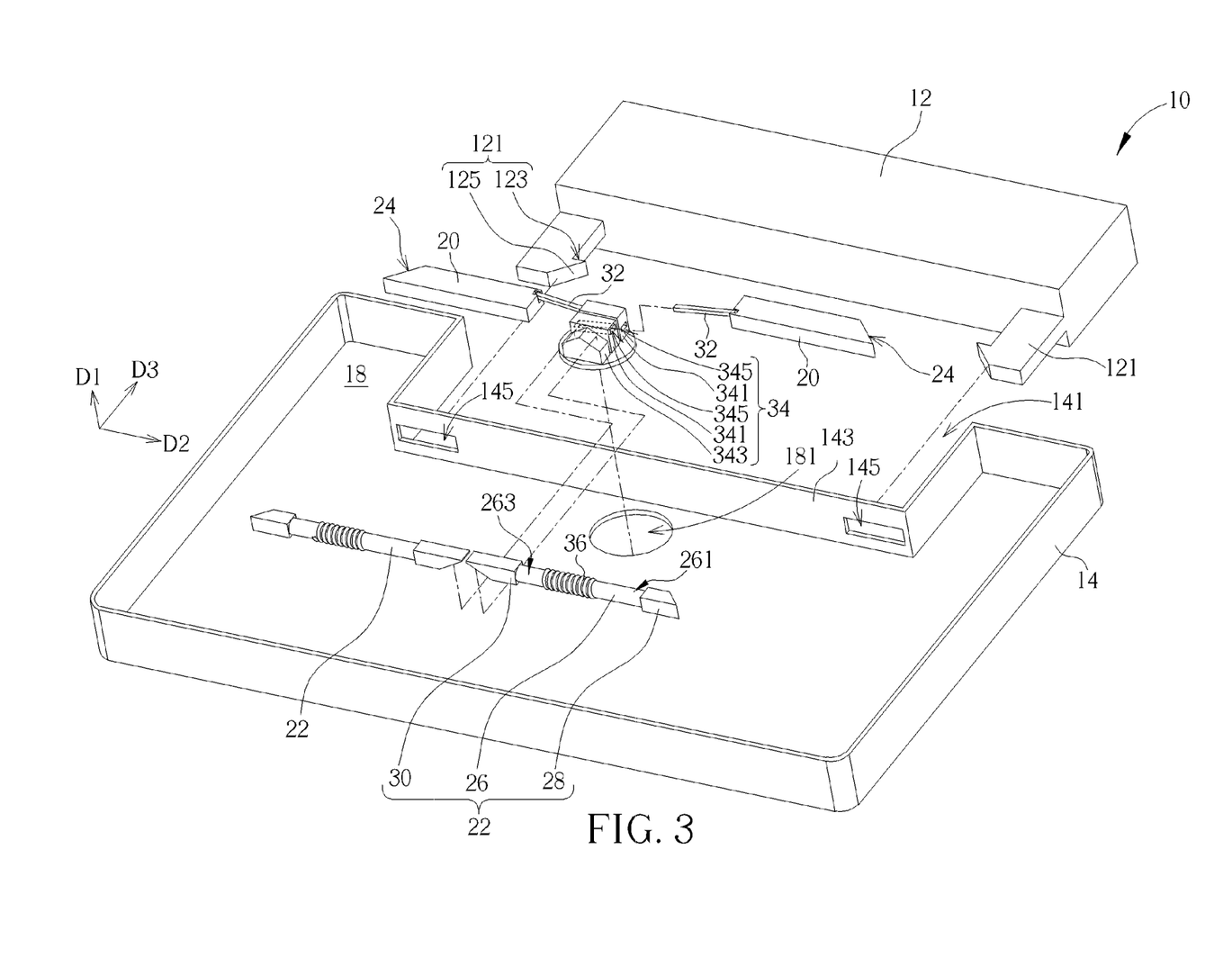
FIG. 3 is an exploded diagram of the electronic device according to the embodiment of the present invention.

Please refer to FIG. 1 to FIG. 3. FIG. 1 and FIG. 2 respectively are diagrams of an electronic device 10 in different views according to an embodiment of the present invention. FIG. 3 is an exploded diagram of the electronic device 10 according to the embodiment of the present invention. The electronic device 10 includes an electronic component 12, a casing 14 and a lock mechanism 16. The electronic device 10 can be the notebook computer, and the electronic component 12 can be the battery to provide power energy for the notebook computer. The electronic component 12 includes two fix portions 121. The fix portions 121 can be hook structures respectively disposed on two ends of the electronic component 12. The casing 12 includes a sunken structure 141, and two opening 145 are formed on a lateral wall 143 of the sunken structure 141. The electronic component 12 can be disposed inside the sunken structure 141. Each fix portion 131 passes through the corresponding opening 145 to be locked by the lock mechanism 16, so as to fix the electronic component 12 inside the sunken structure 141 of the casing 14. The fix portion 121 includes a stop structure 123 and a guide structure 125.

As shown in FIG. 2 and FIG. 3, the lock mechanism 16 is disposed inside the casing 14. The lock mechanism 16 includes a base 18, two constraining components 20 and two recovering components 22. A hole 181 is formed on a surface of the base 18. The constraining component 20 and the recovering component 22 are movably disposed on the base 18. Each constraining component 20 can include a wedged structure 24 for contacting against the stop structure 123 of the fix portion 121, so as to constrain a movement of the electronic component 12. Each recovering component 22 includes a bar 26, a first inclined structure 28 and a second inclined structure 30. The first inclined structure 28 and the second inclined structure 30 are respectively disposed on a first end 261 and a second end 263 of the bar 26. The first end 261 is opposite to the second end 263. The first inclined structure 28 contacts against the guide structure 125 of the fix portion 121, so as to space the electronic component 12 from the sunken structure 141. In addition, the first inclined structure 28 and the wedged structure 24 can buckle two sides of the fix portion 121 for stably accommodating the electronic component 12 inside the sunken structure 141, which means the first inclined structure 28 and the wedged structure 24 are engaged with the guide structure 125 and the stop structure 12, to prevent the electronic component 12 inside the sunken structure 141 from shake.

In addition, the lock mechanism 16 further includes two bridging components 32, an actuating component 34 and two resilient components 36. Two ends of the bridging component 32 are respectively connected to the corresponding constraining component 20 and the actuating component 34. The actuating component 34 movably passes through the hole 181 on the base 18, and each resilient component 36 is disposed on the bar 26 of the corresponding recovering component 22. The actuating component 34 of the present invention can include two first actuating portions 341 and a second actuating component 343. Each bridging component 32 can be connected between the corresponding first actuating portion 341 and the corresponding constraining component 20. The second actuating portion 343 can contact against the second inclined structure 30 of the recovering component 22. Because the second actuating portion 343 is disposed adjacent by the first actuating portion 341, the first actuating portion 341 and the second actuating portion 343 can simultaneously drive the constraining component 20 and the recovering component 22 when the actuating component 34 is pressed, so as to release constraint of the lock mechanism 16 and to separate the electronic component 12 from the sunken structure 141 by one touch.

As shown in FIG. 2 and FIG. 3, the actuating component 34 can move relative to the hole 181 on the base 18 along a first direction D1. The first direction D1 can be substantially parallel to a planar normal vector of the base 18, which means the actuating component 34 is pressed by user. Then, the bridging component 32 can slide the constraining component 20 relative to the base 18 along a second direction D2, and the second direction D2 can be substantially perpendicular to the first direction D1. In the embodiment, a guide slot 345 can be disposed inside the actuating component 34, and a structural direction of the guide slot 345 can be between the first direction D1 and the second direction D2. The bridging component 32 can be a linkage. An end (fix end) of the linkage pivots to the constraining component 20, and the other end (free end) of the linkage is slidably disposed inside the guide slot 345 on the actuating component 34. Therefore, the lock mechanism 16 can utilize a combination of the guide slot 345 and the linkage (the bridging component 32) to effectively turn the force application, so that the force applied to the actuating component 34 along the first direction D1 can be turned to move the constraining component 20 along the second direction D2, so as to release the constraint of the lock mechanism 16. The present invention can effectively minimize volume of the lock mechanism 16, and the lock mechanism 16 can be suitably applied to the thin-type electronic device 10.

Figure 4:
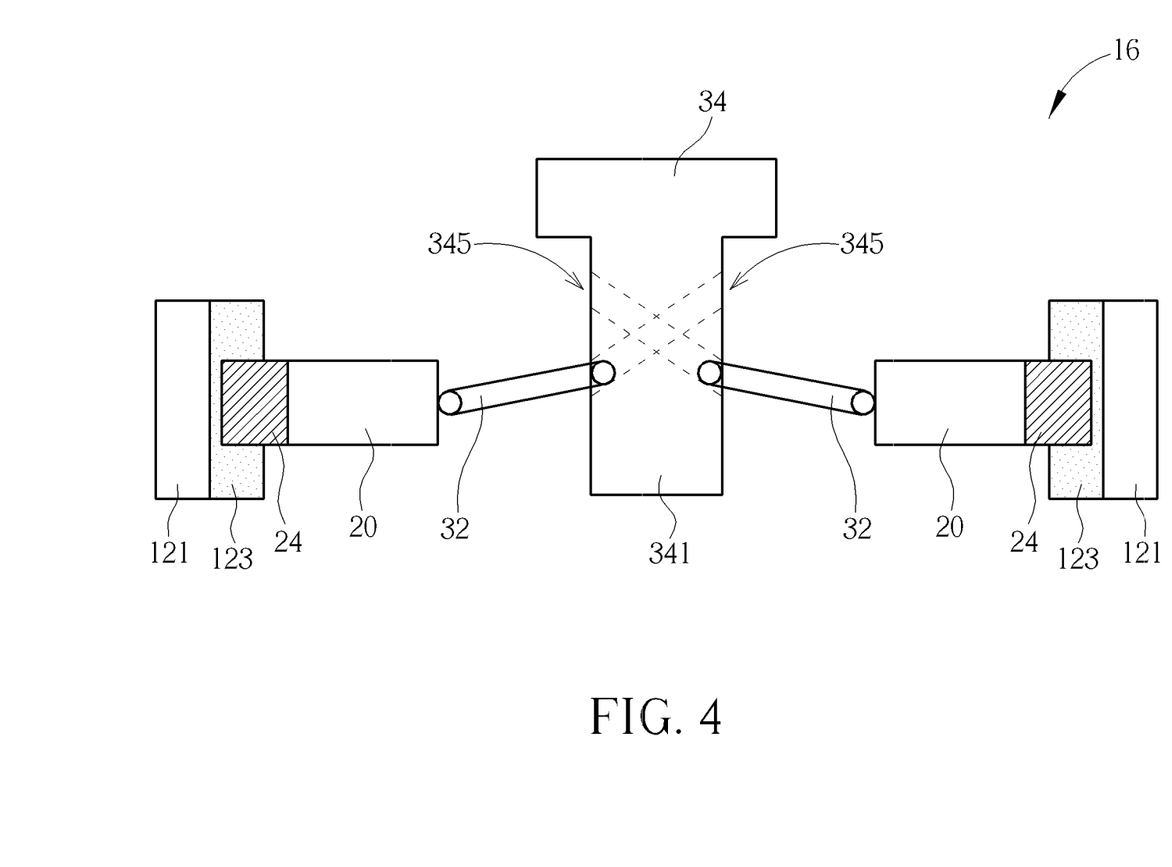
FIG. 4 and FIG. 5 respectively are diagrams of a lock mechanism in different operating modes according to the embodiment of the present invention.
Figure 5:
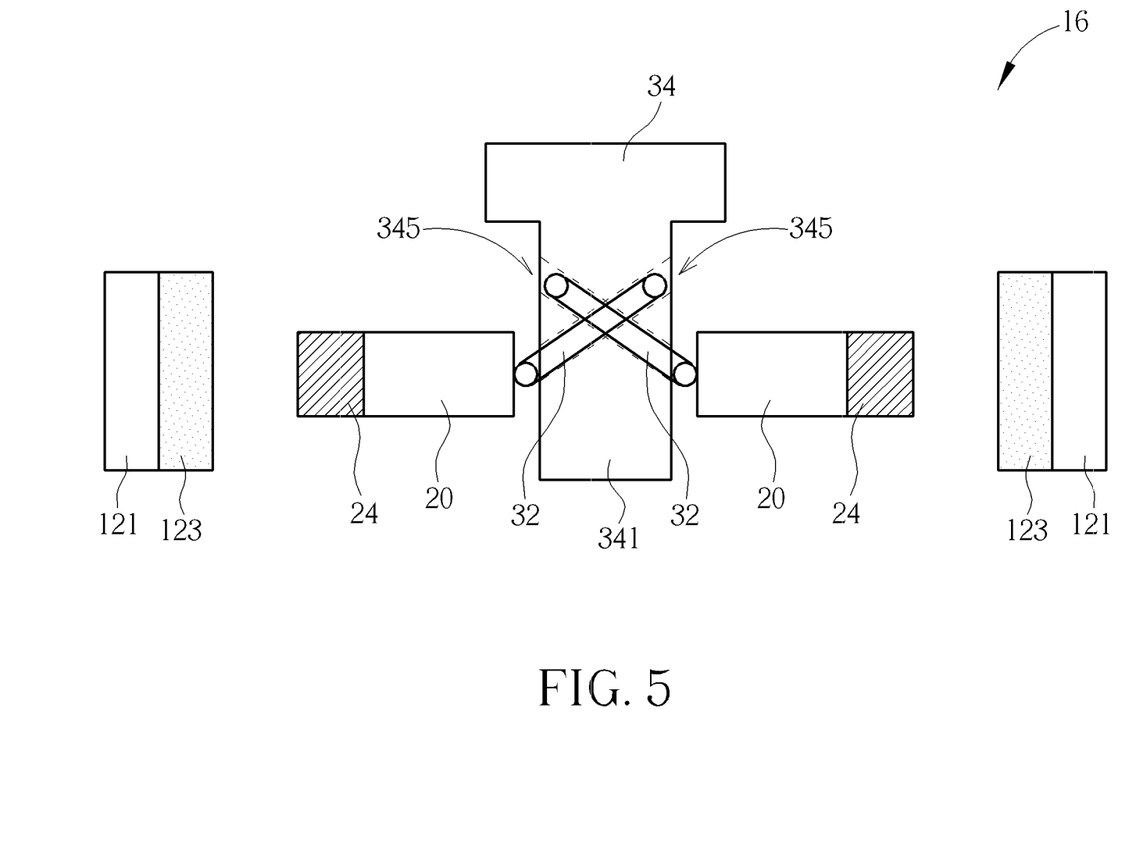

Please refer to FIG. 3 to FIG. 5. FIG. 4 and FIG. 5 respectively are diagrams of the lock mechanism 16 in different operating modes according to the embodiment of the present invention. As shown in FIG. 4, the electronic component 12 is fixed inside the sunken structure 141 by the lock mechanism 16. The wedged structure 24 of the constraining component 20 contacts against the stop structure 123 of the fix portion 121, and the free end of the linkage (the bridging component 32) is located at a bottom of the guide slot 345. When the actuating component 34 is pressed, as shown in FIG. 5, the free end of the linkage (the bridging component 32) can move from the bottom to the top of the guide slot 345. Because the fix end of the linkage (the bridging component 32) pivots to the constraining component 20, the linkage (the bridging component 32) drives the constraining component 20 to be close to the actuating component 34, so that the wedged structure 24 can be spaced from the stop structure 123, and constraint of the constraining component 20 relative to the fix portion 121 of the electronic component 12 is released.

Figure 6:
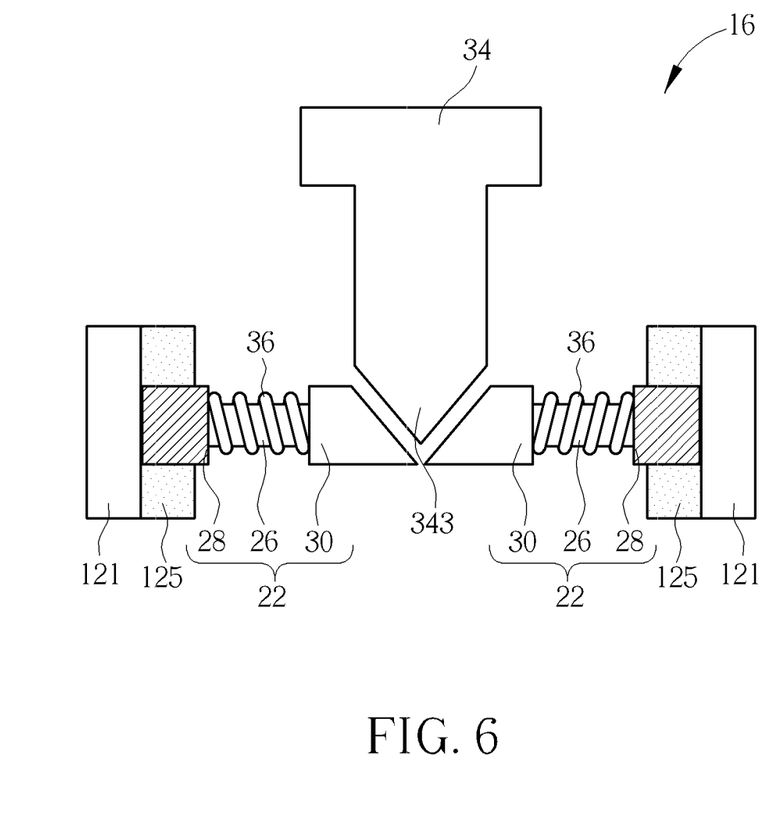
FIG. 6 and FIG. 7 respectively are diagrams of the lock mechanism at the other view in different operating modes according to the embodiment of the present invention.
Figure 7:
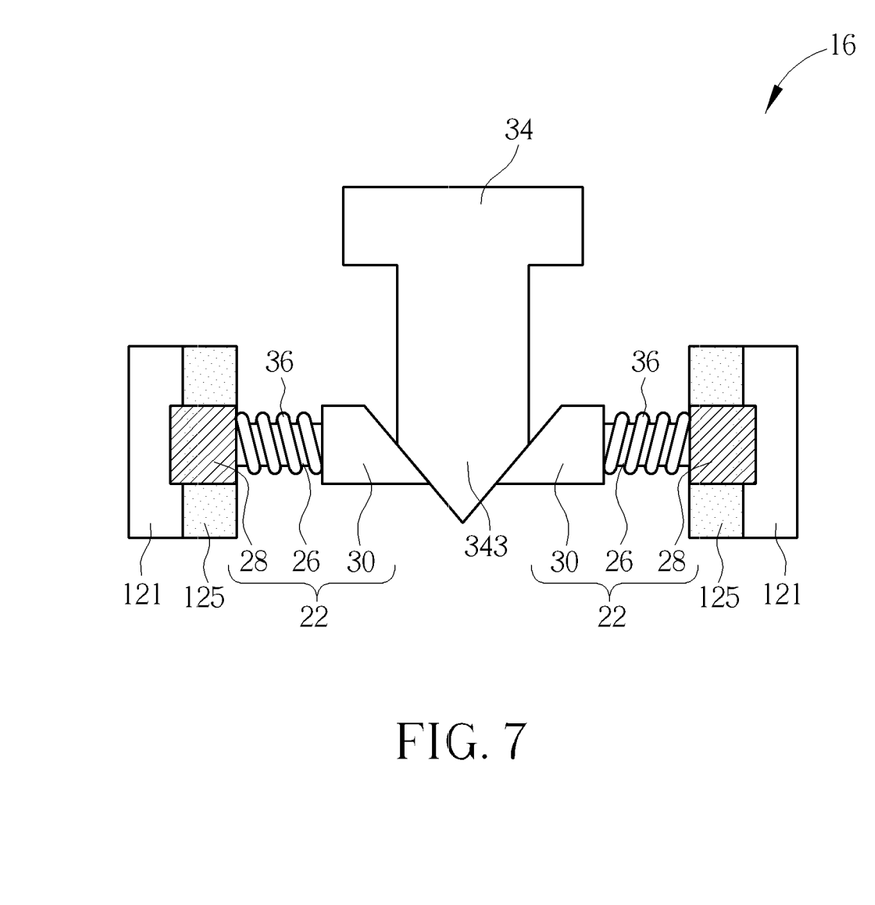

Please refer to FIG. 3, FIG. 6 and FIG. 7. FIG. 6 and FIG. 7 respectively are diagrams of the lock mechanism 16 at the other view in different operating modes according to the embodiment of the present invention. As shown in FIG. 6, the electronic component 12 is fixed inside the sunken structure 141 by the lock mechanism 16. The second actuating portion 343 of the actuating component 34 does not contact (or slight touch) the second inclined structure 30 of the recovering component 22. When the actuating component 34 is pressed, as shown in FIG. 7, the second actuating portion 343 can slide relative to the second inclined structure 30, so as to push the two recovering components 22 outwardly. Because the recovering component 22 is a rigid object, the first inclined structure 28 of the recovering component 22 can push the guide structure 125 of the fix portion 121, and the electronic component 12 can be slightly spaced from the sunken structure 141. The electronic component 12 can be taken off manually. Besides, when the actuating component 34 pushes the recovering component 22 outwardly, the resilient component 35 disposed on the bar 26 can be compressed to store a resilient recovering force. As the external force is removed, the resilient recovering force of the resilient component 36 can reversely push the actuating component 34 via the recovering component 22, and the recovering component 22 can be moved from a position shown in FIG. 7 to a position show in FIG. 6.

In process of the lock mechanism 16, the actuating component 34 can drive the constraining component 20 to release constraint of the fix portion 121 before driving the recovering component 22 to push the electronic component 12 outwardly via the fix portion 121. The lock mechanism 16 of the present invention can design that an end of the recovering component 22 protrudes from an outer end of the adjacent constraining component 20, as shown in FIG. 2, so that the first inclines structure 28 can push the guide structure 125 after the wedged structure 24 is separated from the stop structure 123. Further, the lock mechanism 16 of the present invention can design that the first actuating portion 341 slides relative to the bridging component 32 is actuated earlier than the second actuating portion 343 slides relative to the second inclined structure 30. For example, an end (the outlet shown in figures) of the guide slot 345 is higher than a tip of the second actuating portion 343, as shown in FIG. 3. The first actuating portion 341 can guide the bridging component 32 to move the constraining component 30 for constraint release of the fix portion 121, and then the second actuating portion 343 contacts against the recovering component 22 to push the electronic component 12 outwardly via the fix portion 121. Further, the lock mechanism 16 of the present invention can design that an inclined angle of each guide slot 345 formed inside the first actuating portion 341 is substantially greater than an inclined angle of the tip of the second actuating portion 343, as shown in FIG. 3. When the actuating component 34 is pressed, a relative slide between the bridging component 32 and the guide slot 345 can be substantially greater than a relative slide between the second actuating portion 343 and the second inclined structure 30.

Figure 8:
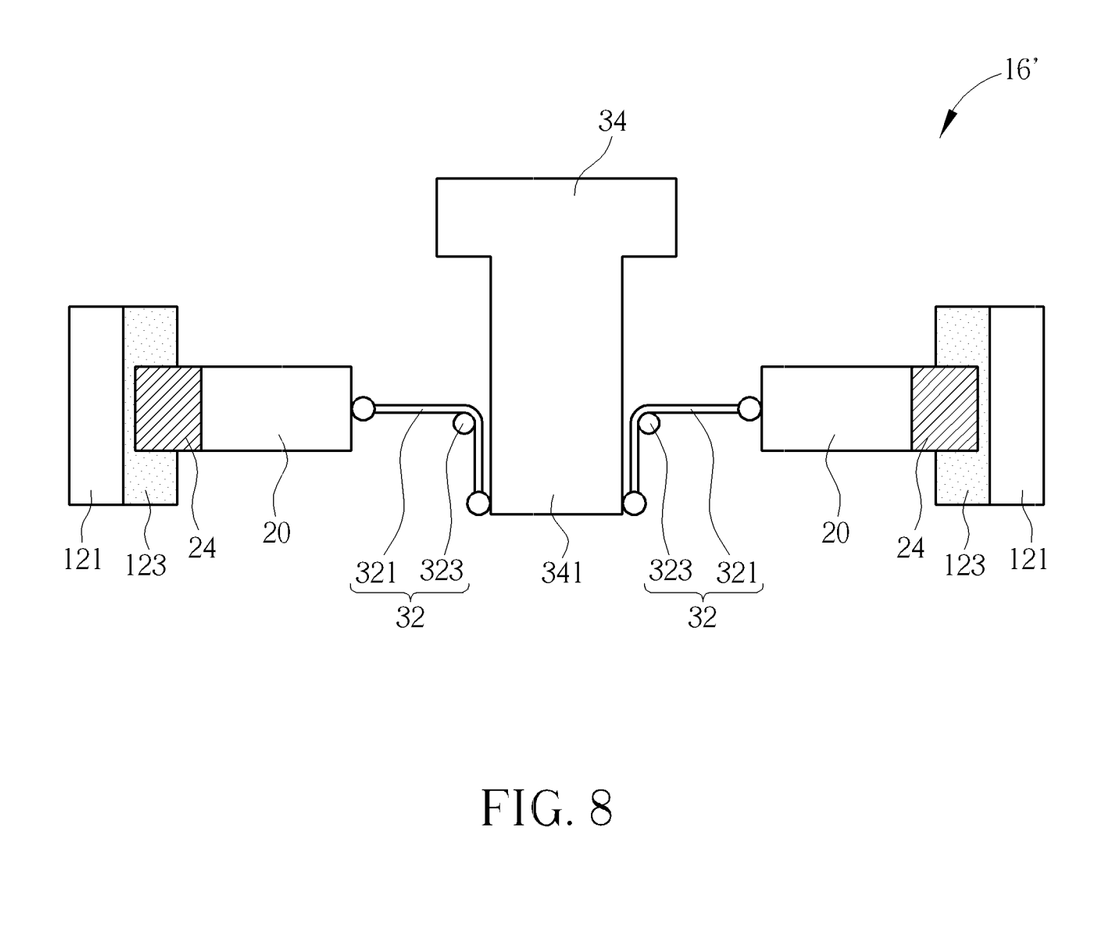
FIG. 8 and FIG. 9 respectively are diagrams of the lock mechanism in different operating modes according to the other embodiment of the present invention.
Figure 9:
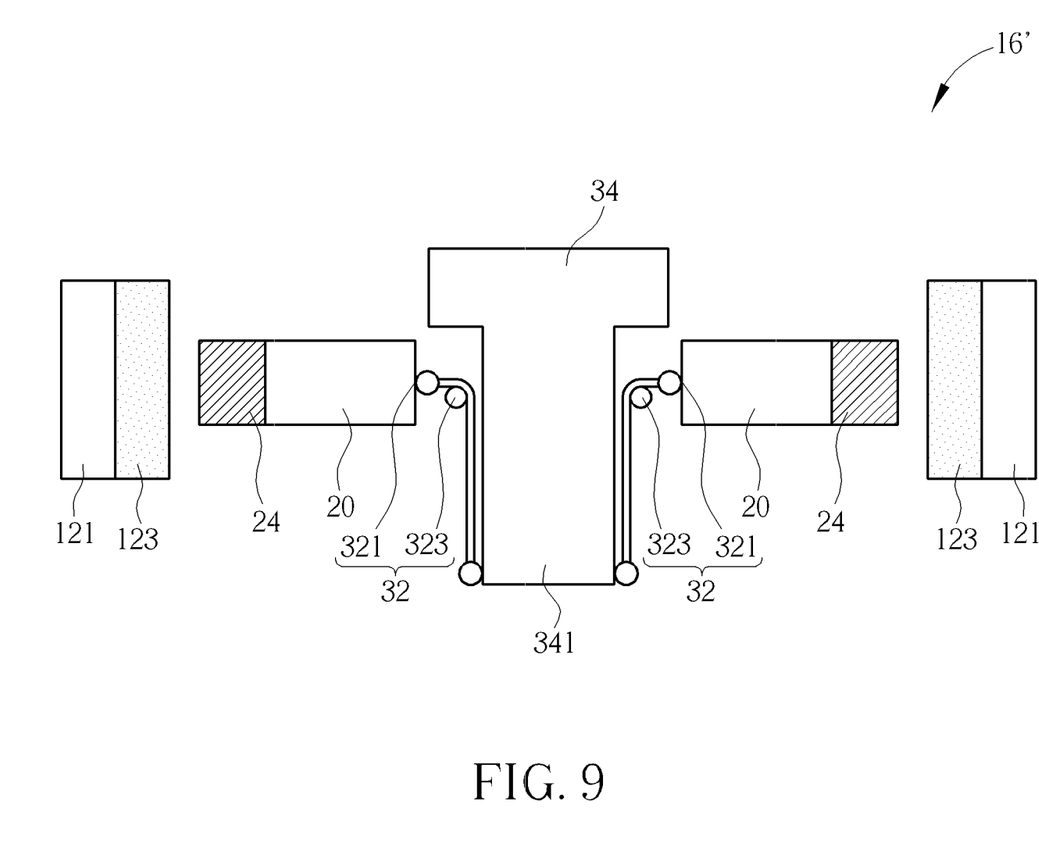

Please refer to FIG. 3, FIG. 8 and FIG. 9. FIG. 8 and FIG. 9 respectively are diagrams of the lock mechanism 16' in different operating modes according to the other embodiment of the present invention. The bridging component 32 of the lock mechanism 16' includes a cable 321 and a roller 323. Two ends of the cable 321 are respectively connected to the constraining component 20 and the actuating component 34, and the cable 321 slides relative to the roller 323. As shown in FIG. 8, the actuating component 34 is located at an initial position, and the wedged structure 24 of the constraining component 20 contacts against the stop structure 123 of the fix portion 121 to constraint the movement of the fix portion 121. As shown in FIG. 9, the actuating component 34 moves downwardly to pull the cable 321 when the actuating component 34 is pressed. The cable 321 drives the constraining component 20 to be close to the actuating component 34 by the roller 323, so as to separate the wedged structure 24 from the stop structure 123 and to release the constraint of the fix portion 121 by the constraining component 20. Application of the bridging component in the present invention is not limited to the above-mentioned embodiment, and depends on design demand.

In conclusion, the lock mechanism of the present invention connects the first actuating portion and the second actuating portion of the actuating component respectively to the constraining component and the recovering component. When the actuating component is pressed, the first actuating portion can utilize the bridging component to move the constraining component, so as to separate the wedged structure from the fix portion. Meanwhile, the second actuating portion slides relative to the second inclined structure, so the first inclined structure of the recovering component can push the fix portion to separate the electronic component from the sunken structure. As the external force applied to the actuating component is removed, the resilient recovering force of the resilient component reversely drives the recovering component, and the recovering component can push the actuating component out of the hole on the base. Due to the movement of the actuating component, the first actuating portion can push the constraining component via the bridging component, and the lock mechanism is back to the initial mode. It is to say, the lock mechanism of the present invention can be utilized to release the constraint of the fix portion by the constraining component and to drive the recovering component to push the fix portion for separation of the electronic component simultaneously by one touch. Therefore, the lock mechanism of the present invention has advantages of simple structure, operation convenience and low manufacturing cost. The present invention can guide the perpendicular pressing force to drive the lock mechanism in parallel movement, so the volume of the lock mechanism can be minimized to preferably apply to the thin-type electronic device, so as to increase market competition of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lock mechanism comprising:
a base, a hole being formed on a surface of the base;
at least one constraining component movably disposed on the base, the constraining component contacting against a fix portion of an electronic component to constrain a movement of the electronic component;
at least one recovering component movably disposed on the base, the recovering component comprising:
a bar, the bar comprising a first end and a second end, the second end being opposite to the first end;
a first inclined structure disposed on the first end of the bar, the first inclined structure pushing the fix portion to move the electronic component; and
a second inclined structure disposed on the second end of the bar;
a bridging component; and
an actuating component movably passing through the hole on the base, two ends of the bridging component being respectively connected to the constraining component and the actuating component, the actuating component moving relative to the hole to drive the bridging component to separate the constraining component from the fix portion, the actuating component further pushing the second inclined structure to move the fix portion via the first inclined structure.

2. The lock mechanism of claim 1, wherein the fix portion comprises a stop structure and a guide structure, the constraining component contacts against the stop structure, and the first inclined structure contacts against the guide structure.

3. The lock mechanism of claim 1, wherein the bridging component is a linkage, an end of the linkage pivots to the constraining component, and the other end of the linkage is slidably disposed on a guide slot on the actuating component.

4. The lock mechanism of claim 3, wherein the actuating component moves relative to the base along a first direction, the constraining component moves relative to the base along a second direction substantially perpendicular to the first direction, a structural direction of the guide slot is between the first direction and the second direction.

5. The lock mechanism of claim 4, wherein the first direction is substantially parallel to a planar normal vector of the base.

6. The lock mechanism of claim 3, wherein the recovering component comprises a wedged structure for wedging with the fix portion.

7. The lock mechanism of claim 1, wherein the bridging component comprises a cable and a roller, two ends of the cable are respectively connected to the constraining component and the actuating component, and the cable moves relative to the roller.

8. The lock mechanism of claim 3, wherein the actuating component comprises a first actuating portion and a second actuating portion, the bridging component is disposed between the first actuating portion and the constraining component, the second actuating portion is disposed on a position adjacent to the first actuating portion and contacts against the second inclined structure.

9. The lock mechanism of claim 8, wherein an inclined angle of the guide slot is substantially greater than an inclined angle of the second actuating portion.

10. The lock mechanism of claim 1, further comprising:
a resilient component disposed on the bar of the recovering component, the resilient component driving the recovering component to push the actuating component.

11. An electronic device comprising:
an electronic component, the electronic component comprising a fix portion;
a casing, the casing comprising a sunken structure, an opening being formed on a lateral wall of the sunken structure, the electronic component being accommodated inside the sunken structure; and
a lock mechanism disposed inside the casing, the fix portion of the electronic component passing through the opening to be locked by the lock mechanism, the lock mechanism comprising:
a base, a hole being formed on a surface of the base;
at least one constraining component movably disposed on the base, the constraining component contacting against the fix portion to constrain a movement of the electronic component;
at least one recovering component movably disposed on the base, the recovering component comprising:
a bar, the bar comprising a first end and a second end, the second end being opposite to the first end;
a first inclined structure disposed on the first end of the bar, the first inclined structure pushing the fix portion to move the electronic component; and
a second inclined structure disposed on the second end of the bar;
a bridging component; and
an actuating component movably passing through the hole on the base, two ends of the bridging component being respectively connected to the constraining component and the actuating component, the actuating component moving relative to the hole to drive the bridging component to separate the constraining component from the fix portion, the actuating component further pushing the second inclined structure to move the fix portion via the first inclined structure.

12. The electronic device of claim 11, wherein the fix portion comprises a stop structure and a guide structure, the constraining component contacts against the stop structure, and the first inclined structure contacts against the guide structure.

13. The electronic device of claim 11, wherein the bridging component is a linkage, an end of the linkage pivots to the constraining component, and the other end of the linkage is slidably disposed on a guide slot on the actuating component.

14. The electronic device of claim 13, wherein the actuating component moves relative to the base along a first direction, the constraining component moves relative to the base along a second direction substantially perpendicular to the first direction, a structural direction of the guide slot is between the first direction and the second direction.

15. The electronic device of claim 14, wherein the first direction is substantially parallel to a planar normal vector of the base.

16. The electronic device of claim 13, wherein the recovering component comprises a wedged structure for wedging with the fix portion.

17. The electronic device of claim 11, wherein the bridging component comprises a cable and a roller, two ends of the cable are respectively connected to the constraining component and the actuating component, and the cable moves relative to the roller.

18. The electronic device of claim 13, wherein the actuating component comprises a first actuating portion and a second actuating portion, the bridging component is disposed between the first actuating portion and the constraining component, the second actuating portion is disposed on a position adjacent to the first actuating portion and contacts against the second inclined structure.

19. The electronic device of claim 18, wherein an inclined angle of the guide slot is substantially greater than an inclined angle of the second actuating portion.

20. The electronic device of claim 11, wherein the lock mechanism further comprises:
   a resilient component disposed on the bar of the recovering component, the resilient component driving the recovering component to push the actuating component.

* * * * *